United States Patent [19]

Burchfield

[11] Patent Number: 5,587,666
[45] Date of Patent: Dec. 24, 1996

[54] SENSE AMPLIFIER SLEW CIRCUITRY

[75] Inventor: Mark E. Burchfield, Austin, Tex.

[73] Assignee: Cyrix Corporation, Richardson, Tex.

[21] Appl. No.: 428,983

[22] Filed: Apr. 26, 1995

[51] Int. Cl.[6] .............................................. H03K 19/017
[52] U.S. Cl. ........................... 326/17; 326/95; 326/112
[58] Field of Search ................................. 326/17, 21, 49, 326/50, 83, 112, 121, 27, 95, 98

[56] References Cited

U.S. PATENT DOCUMENTS

| | | | |
|---|---|---|---|
| 4,876,465 | 10/1989 | Podkowa et al. | 326/83 |
| 5,039,874 | 8/1991 | Anderson | 326/112 |
| 5,041,746 | 8/1991 | Webster et al. | 326/49 |
| 5,146,115 | 9/1992 | Benhamida | 326/95 |
| 5,208,489 | 5/1993 | Houston | 326/98 |
| 5,208,490 | 5/1993 | Yetter | 326/98 |

Primary Examiner—Edward P. Westin
Assistant Examiner—Benjamin D. Driscoll
Attorney, Agent, or Firm—Andrew S. Viger; John L. Maxin

[57] ABSTRACT

A pre-charge load device to pre-charge an input on a sense amplifier is coupled between a positive voltage rail and the input to the sense amplifier and is biased by a bias network coupled between the positive voltage rail and the sense amplifier input to adapt the sense amplifier slew rate in relation to large or unpredictable capacitive impedance changes on the sense amplifier input.

13 Claims, 4 Drawing Sheets

SENSE AMPLIFIER SLEW CIRCUITRY

BACKGROUND OF THE INVENTION

1. Field of the Invention

The invention relates generally to sense amplifiers, and more particularly to circuitry that improves input slewing on sense amplifiers having relatively high or unpredictable capacitive inputs.

2. Description of Related Art

The trends in electronic circuit design are increases in speed, levels of integration, and the seemingly inconsistent—portable operation. This is so since increases in speed and integration typically increase power consumption which is detrimental to battery operation. However at the expense of power consumption, power hungry sense amplifiers have been used in a number of circuit applications to speed-up the transition time between changes in logic levels. For the most part, this is accomplished by compressing input levels to just above or below the switch point of a sensing inverter. The swing or "slew" of the input therefore, need not be as large to trigger states. This level "compression" however is not without limitations—including the increase in power consumption.

By way of background, FIG. 1 depicts a typical prior art sense amplifier 10 having an input node 14 coupled to receive logic input signals from an N-channel MOSFET logic tree 12. The input node 14 is coupled to the sources of load P-channel transistor 28 and fast recovery N-channel transistor 36, and to an input on sensing inverter 32. An output on inverter 32 drives the gate of fast recovery transistor 36, an input on feedback inverter 30, and an input on output driver inverter 34. An output on feedback inverter 30 drives the gate of load transistor 28. The drains of load transistor 28 and fast recovery transistor 36 are coupled to the supply voltage $V_{DD}$. The output voltage on driver inverter 34 swings substantially between ground and $V_{DD}$ to restore logic levels to their normal amplitudes.

In an improved but not entirely satisfactory technique, sense amplifiers have been constructed with enable lines to enable power consuming activities only when necessary. Another limitation however, with most sense amplifiers in general, including those with enable lines, is the inability to swiftly pull the input node 14 to $V_{DD}$ (i.e. recover to a high state) when the input node 14 dynamically exhibits a high or unpredictable capacitive impedance. This condition typically occurs when either: (i) the sense amplifier has an enable line which is dynamically enabled, (ii) the logic tree 12 dynamically presents multiple pull down paths, or (iii) the logic tree 12 is dynamically changed such as in a read only memory (ROM) row/column select mechanism, described in more detail hereinbelow.

As an illustrative example, reference is now made to FIG. 2 which depicts a typical ROM row/column select mechanism 40 employing a sense amplifier 10. The input capacitance on input node 14 to sense amplifier 10 is highly dependent and dynamic upon which row is selected by row select circuitry 42 and by which column is selected by column select circuitry 44. It is conceivable therefore, that the input capacitance on input node 14 to sense amplifier 10 will radically and dynamically change if the column select circuitry 44 selects a column before the row select circuitry 42 has properly selected a row. More specifically, it is possible that the input node 14 will see "N" transitory row selections pulling to ground if the row select circuitry 42 is undefined when the column has been selected. Accordingly, the slew rate of sense amplifier 10 is slowed when the quiescent row selection is high and "N" transitory row selections are pulling to ground (or exhibit a high capacitance) since transistors 28 and 36 in the sense amplifier 10 haven't had a chance to recover (i.e. charge the input capacitance).

The typical approach in addressing the aforementioned problem is to add individual sense amplifiers for each column select line to ameliorate the effects of row/column select loading. Adding such sense amplifiers however, not only dramatically increases power consumption, but also increases component count, conditions which are extremely unfavorable in portable environments.

It can be seen therefore, that there is a need to increase the slew rate of a sense amplifier in situations of large or unpredictable input capacitance, without the need to add more sense amplifiers.

SUMMARY OF THE INVENTION

To overcome the limitations of the prior art described above, and to overcome other limitations that will become apparent upon reading and understanding the present specification, the present invention discloses circuitry that increases the slew rate of a sense amplifier to accommodate situations of large or unpredictable input capacitance.

A feature of the present invention is the ability to handle large or unpredictable input capacitance while maintaining compressed levels above and below the logic switch point to accelerate the switching speed.

Another feature of the present invention is the ability to handle unpredictable input capacitance without compromising slew rate.

Yet another feature of the present invention is the ability to disable the slewing circuitry to the sense amplifier in speed insensitive operations.

These and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a specific example of slewing circuitry for a sense amplifier practiced in accordance with the present invention.

DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
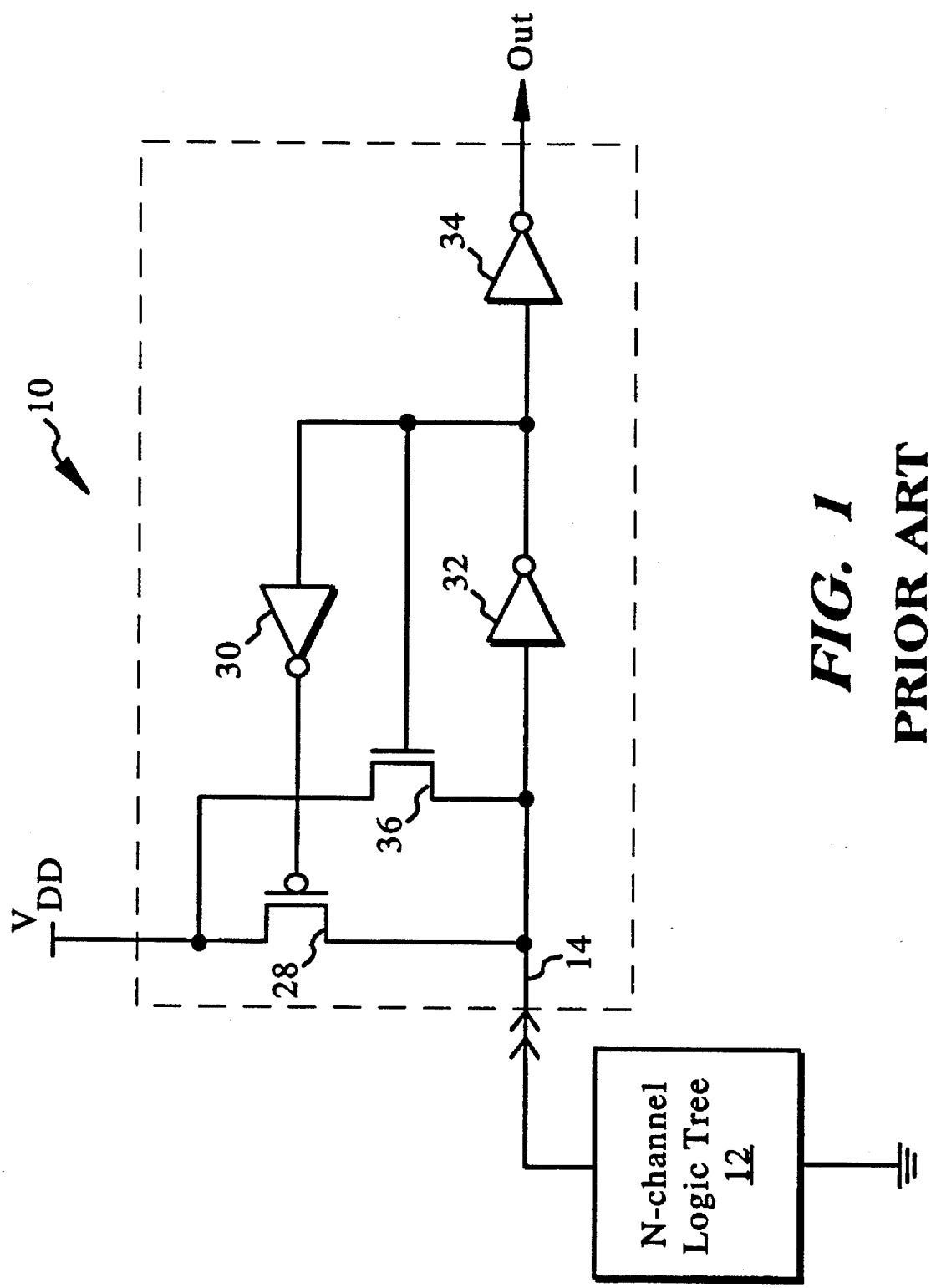
FIG. 1 is a schematic diagram of a typical prior art sense amplifier.
Figure 2:
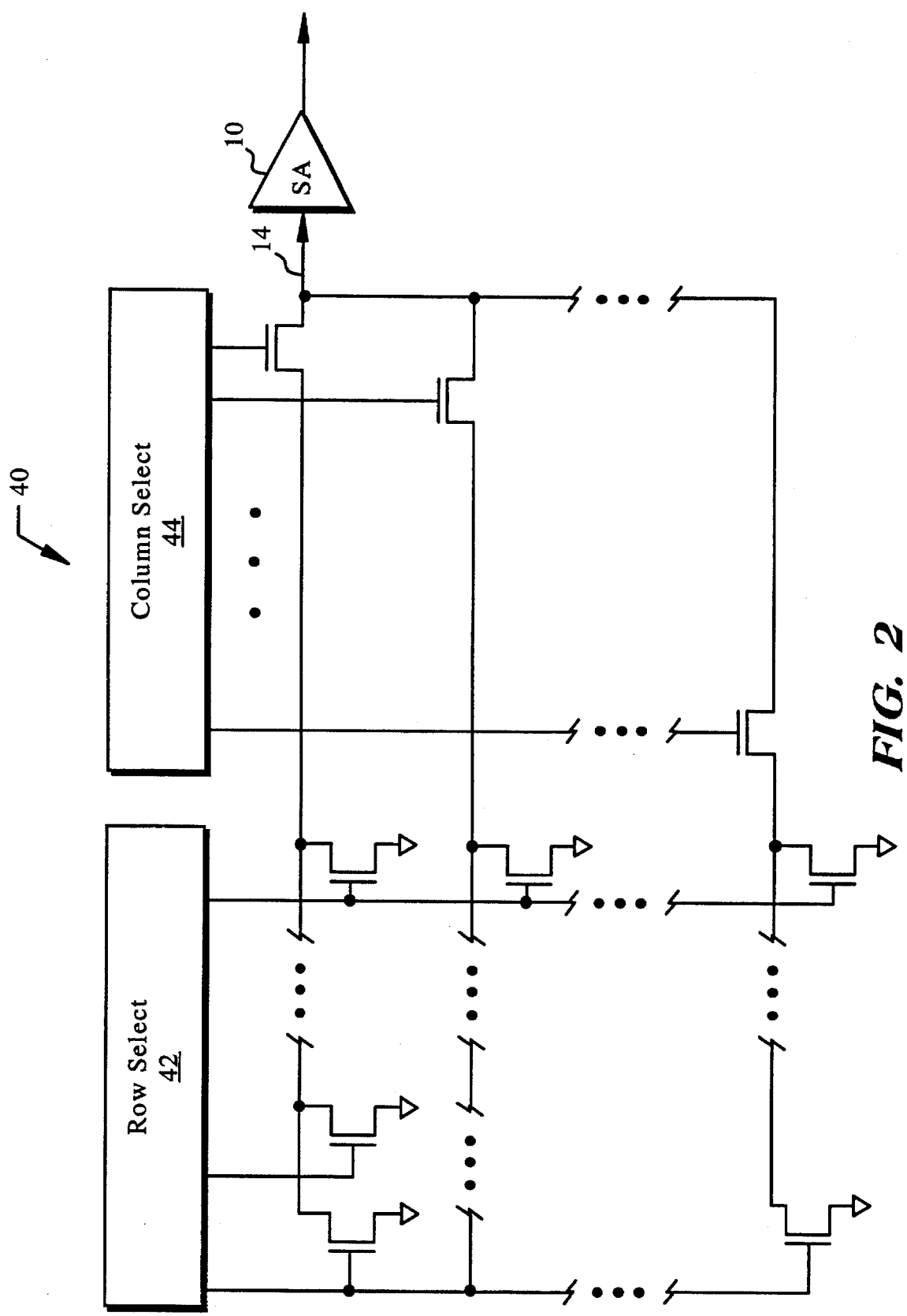
FIG. 2 is a schematic diagram of an exemplary read only memory row/column selection mechanism which can exhibit unpredictable/transitory high capacitive characteristics.
Figure 3:
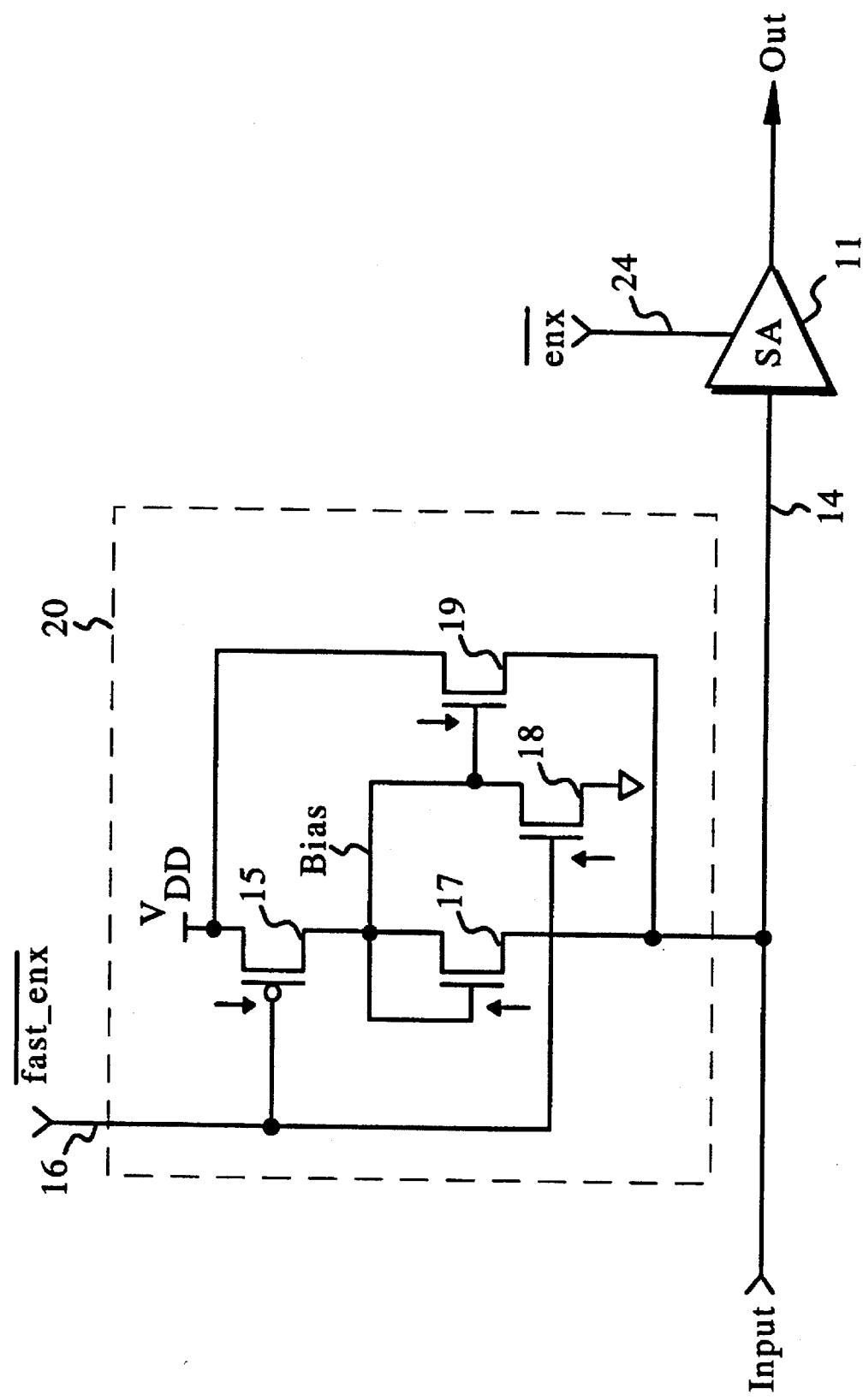
FIG. 3 is a schematic diagram of circuitry for improving the slew rate of a sense amplifier, practiced in accordance with the principles of the present invention; and, FIG. 4 is a schematic diagram of the preferred embodiment for a sense amplifier depicted in FIG. 3.

Reference is now made to FIG. 3 which depicts slew rate circuitry 20 for improving the input slew rate of a sense amplifier 11. A P-channel transistor 15 has its source coupled to the positive voltage rail ($V_{DD}$), its gate coupled to an active low enable input (fast_enx) 16, and its drain to the drains of N-channel transistors 17 and 18, and the gate of pre-charge load device N-channel transistor 19, all forming a Bias node. N-channel transistor 17 is coupled in saturation with its gate and drain coupled together and to the Bias node, and its source coupled to the source of pre-charge load device N-channel transistor 19 and to the input node 14 on sense amplifier 11. The combination of P-channel transistor 15 and N-channel transistor 17 form a biasing network to bias pre-charge load device N-channel transistor 19 into the proper conduction mode.

If an N-channel transistor in logic tree 12 sinks current from input node 14, the voltage at the Bias node will lower slightly due to the increased conduction of N-channel transistor 17. Fast turn-off N-channel transistor 18 has its gate coupled to the active low enable input (fast_enx) 16 and its source to the negative voltage rail (ground). If fast_enx16 is asserted high (i.e. disabled), fast turn-off N-channel transistor 18 immediately shunts the gate of pre-charge load device N-channel transistor 19 to ground thus disabling the precharge of input node 14.

Pre-charge load device N-channel transistor 19 has its drain coupled to the positive voltage rail ($V_{DD}$) and its gate is biased by the voltage on the Bias node. While pre-charge load device N-channel transistor 19 is depicted singly, it should be understood that a plurality of N-channel transistors could be coupled in parallel to provide additional gain without departing from the scope of the present invention.

If the fast_enxenable input 16 is pulled to $V_{DD}$ (i.e. high), P-channel transistor 15 is turned off and the N-channel transistor 18 is turned on pulling the gate of pre-charge load device N-channel transistor 19 to ground and effectively disabling the slewing circuit. Thus, circuitry which is capable of operation at a slower frequency can disable the slew rate circuitry thus save power. Accordingly, the slew rate circuitry can be dynamically enabled and disabled through assertion of fast_enxenable input 16 for optimal use in portable systems.

Figure 4:
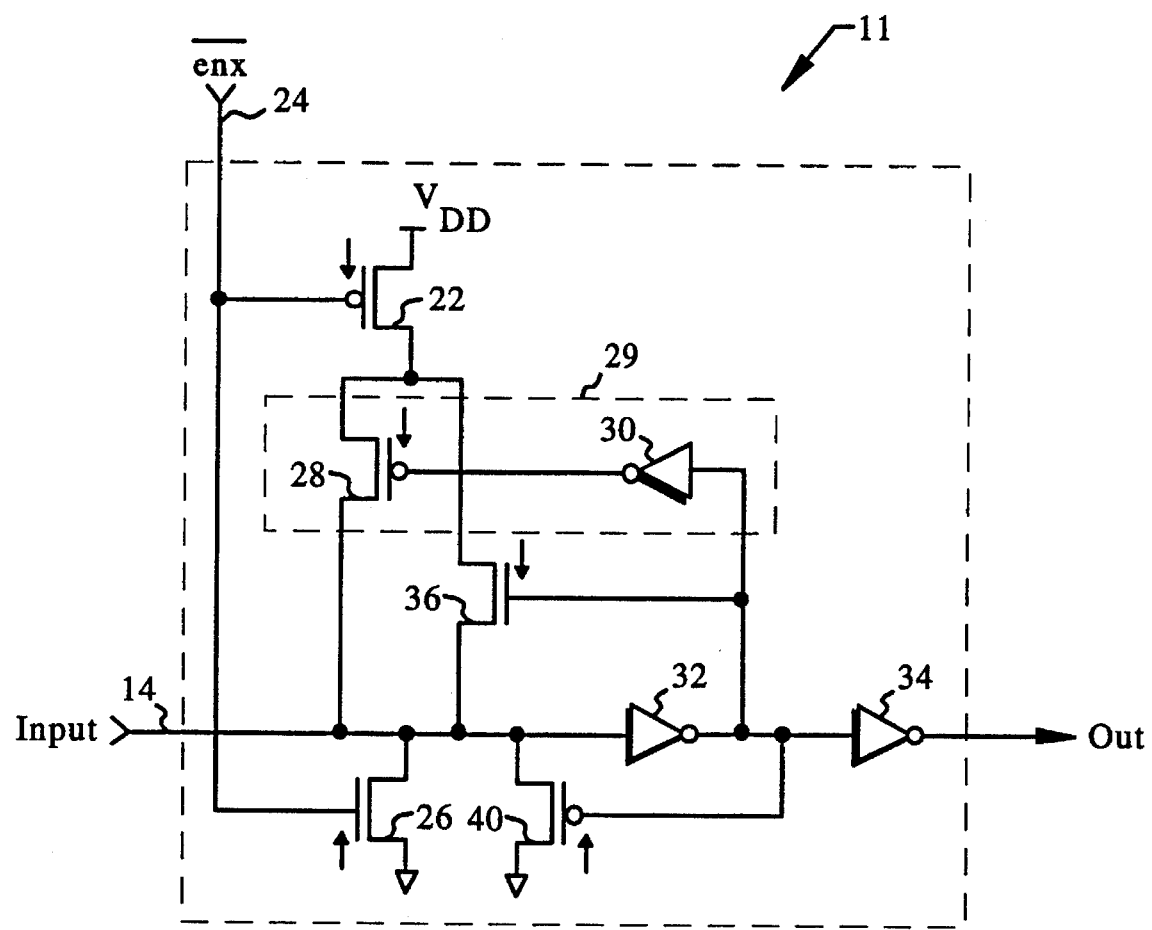

Reference is now made to FIG. 4 which depicts the preferred embodiment of the sense amplifier 11 in FIG. 3. Alternatively, a sense amplifier can be used such as disclosed in co-pending and commonly assigned patent application Ser. No. 08/367,035, entitled "Improved Sense Amplifier". Unless otherwise specified, the MOS transistors described hereinbelow are preferably enhancement mode IGFETs. A P-channel transistor 22 has its source coupled to the positive voltage rail ($V_{DD}$), its gate coupled to an active low enable input 24, and its drain to the source of P-channel transistor 28 and the drain of N-channel transistor 36. It should be understood that the combination of P-channel transistor 28 and inverter 30 could be replaced with an N-channel depletion mode transistor (depicted as dashed 29) without departing from the scope of the present invention.

An N-channel transistor 26 has its drain coupled to input node 14, its source to ground, and its gate to the active low enable input 24. When the sense amplifier 11 is disabled (i.e. the active low enable input 24 is pulled near $V_{DD}$), transistor 26 is turned on pulling input node 14 to ground and transistor 22 is turned off cutting off $V_{DD}$ to the remaining circuitry in the sense amplifier 11.

The primary load device, P-channel transistor 28, has its source coupled to $V_{DD}$ through transistor 22, its drain coupled to the input node 14, and its gate coupled to the output of feedback inverter 30. With the aid of the present disclosure, those skilled in the art will recognize other load devices, such as, but not limited to, depletion mode MOS transistors (e.g. transistor 29 depicted by a dashed box) and poly-resistors, without departing from the scope of the present invention. Fast recovery N-channel transistor 36 has its drain coupled to $V_{DD}$ through transistor 22, its source coupled to input node 14, and its gate to the output of sense inverter 32. Inverter 32 has its input coupled to input node 14 and its output coupled to the input on feedback inverter 30, the gate on N-channel transistor 36, and to the input on output driver inverter 34. The output of driver inverter 34 provides logic compatible voltage swings. Dampening P-channel transistor 40 has its source coupled to the input node 14, its drain to the negative voltage rail (ground), and its gate coupled to the output of inverter 32.

CONCLUSION

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. Slew rate circuitry for a sense amplifier comprising:
   (a) a pre-charge load device coupled between a positive voltage rail and an input on the sense amplifier; and,
   (b) biasing means, coupled between the positive voltage rail and the input on the sense amplifier, for biasing the pre-charge load device in relation to varying capacitance on the input to the sense amplifier.

2. Slew rate circuitry as recited in claim 1 further comprising disabling means, coupled to the biasing means, for disabling the slew rate circuitry.

3. Slew rate circuitry as recited in claim 2 wherein the biasing means comprises:
   (i) a P-channel transistor having a source, a gate, and a drain, the source being coupled to the positive voltage rail, the gate being coupled to the disabling means; and,
   (ii) a first N-channel transistor having a source, a gate, and a drain, the gate and drain being coupled together and to the drain on the P-channel transistor, the source being coupled to the input on the sense amplifier.

4. Slew rate circuitry as recited in claim 3 wherein the biasing means further comprises (iii) a second N-channel transistor having a source, a gate, and a drain, the source being coupled to ground, the drain being coupled to the gate and the drain of the first N-channel transistor (ii), and the gate being coupled to the disabling means.

5. Slew rate circuitry as recited in claim 1 wherein the pre-charge load device is a plurality of N-channel transistors.

6. In a sense amplifier suitable for applications which provide unpredictable input capacitance, slew rate circuitry comprising:
   (a) pre-charging means, coupled between a voltage rail and an input on the sense amplifier, for pre-charging the input on the sense amplifier; and, (b) bias means, coupled between the positive voltage rail and the input on the sense amplifier, for biasing the pre-charging means (a) in relation to varying capacitance on the input to the sense amplifier.

7. Slew rate circuitry as recited in claim 6 further comprising disabling means, coupled to the biasing means, for disabling the slew rate circuitry.

8. Slew rate circuitry as recited in claim 7 wherein the biasing means comprises:

(i) a P-channel transistor having a source, a gate, and a drain, the source being coupled to the positive voltage rail, the gate being coupled to the disabling means; and, (ii) a first N-channel transistor having a source, a gate, and a drain, the gate and drain being coupled together and to the drain on the P-channel transistor, the source being coupled to the input on the sense amplifier.

9. Slew rate circuitry as recited in claim 8 wherein the biasing means further comprises (iii) a second N-channel transistor having a source, a gate, and a drain, the source being coupled to ground, the drain being coupled to the gate and drain of the first N-channel transistor (ii), and the gate being coupled to the disabling means.

10. Slew rate circuitry as recited in claim 6 wherein the pre-charge means is a plurality of N-channel transistors.

11. Slew rate circuitry as recited in claim 7 wherein the sense amplifier further comprises disabling means for disabling the sense amplifier independently of the disabling means for disabling the slew rate circuitry.

12. A method of increasing slew rate in a sense amplifier comprising the steps of:

(a) pre-charging an input on the sense amplifier; and, (b) providing a bias voltage for the pre-charging step in relation to varying capacitance on the input to the sense amplifier.

13. A method as recited in claim 12 further comprising step (c) of disabling the pre-charging step responsive to speed insensitive applications.

\* \* \* \* \*